United States Patent
Satou

(10) Patent No.: US 9,736,926 B2
(45) Date of Patent: Aug. 15, 2017

(54) EPOXY RESIN, CURABLE RESIN COMPOSITION, CURED PRODUCT THEREOF, AND PRINTED CIRCUIT BOARD

(71) Applicant: DIC Corporation, Tokyo (JP)

(72) Inventor: Yutaka Satou, Ichihara (JP)

(73) Assignee: DIC Corporation, Tokyo (JP)

( * ) Notice: Subject to any disclaimer, the term of this patent is extended or adjusted under 35 U.S.C. 154(b) by 113 days.

(21) Appl. No.: 14/431,522

(22) PCT Filed: Aug. 29, 2013

(86) PCT No.: PCT/JP2013/073124
§ 371 (c)(1),
(2) Date: Mar. 26, 2015

(87) PCT Pub. No.: WO2014/050420
PCT Pub. Date: Apr. 3, 2014

(65) Prior Publication Data
US 2015/0257257 A1  Sep. 10, 2015

(30) Foreign Application Priority Data

Sep. 26, 2012  (JP) .................................. 2012-212427

(51) Int. Cl.
*C08G 59/22* (2006.01)
*C08G 59/32* (2006.01)
(Continued)

(52) U.S. Cl.
CPC ........... *H05K 1/0271* (2013.01); *C08G 59/08* (2013.01); *C08G 59/32* (2013.01); *C08G 59/621* (2013.01);
(Continued)

(58) Field of Classification Search
CPC ...... C08G 59/027; C08G 59/04; C08G 59/06; C08G 59/063; C08G 59/08; C08G 59/20; C08G 59/32
See application file for complete search history.

(56) References Cited

U.S. PATENT DOCUMENTS

| | | | | |
|---|---|---|---|---|
| 4,551,508 A | | 11/1985 | Urasaki | |
| 5,155,202 A | * | 10/1992 | Morita | ..................... C08G 8/08 |
| | | | | 525/507 |
| 5,358,980 A | * | 10/1994 | Shiobara | .............. C08G 59/145 |
| | | | | 523/427 |

FOREIGN PATENT DOCUMENTS

| JP | S62-20206 B2 | 5/1987 |
|---|---|---|
| JP | 2000-053739 A | 2/2000 |
| JP | 2000053739 A * | 2/2000 |

OTHER PUBLICATIONS

The machine translation of JP 2000-053739 A; Feb. 2000; Oshimi et al.*

(Continued)

*Primary Examiner* — Karuna P Reddy
(74) *Attorney, Agent, or Firm* — Locke Lord LLP

(57) ABSTRACT

The present invention provides a curable resin composition, a cured product of which has a small change in heat resistance after receiving a thermal history and a low thermal expansion property; a cured product of the curable resin composition; a printed circuit board having a small change in heat resistance; and an epoxy resin which imparts the characteristics described above. The epoxy resin is an epoxy resin which is obtained by polyglycidyl etherification of a reaction product formed from ortho-cresol, a β-naphthol compound, and formaldehyde and which includes as a necessary component, a dimer (x2, formula (1)), a trifunctional compound (x3, formula (2)), and a tetrafunctional compound (x4, formula (3)). The total content of those components is 65% or more in terms of the area rate in GPC measurement.

[Chem. 1]

(1)

[Chem. 2]

(2)

(Continued)

-continued

[Chem. 3]

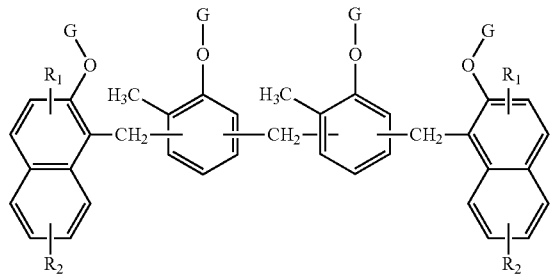

(3)

16 Claims, 4 Drawing Sheets

(51) Int. Cl.
C08G 59/38 (2006.01)
C08G 59/46 (2006.01)
H05K 1/02 (2006.01)
C08G 59/08 (2006.01)
H05K 1/03 (2006.01)
H05K 1/09 (2006.01)
H05K 3/00 (2006.01)
C08G 59/62 (2006.01)
C08G 59/68 (2006.01)

(52) U.S. Cl.
CPC ......... *C08G 59/686* (2013.01); *H05K 1/0326* (2013.01); *H05K 1/0373* (2013.01); *H05K 1/09* (2013.01); *H05K 3/00* (2013.01); *H05K 2203/06* (2013.01); *Y10T 428/31529* (2015.04)

(56) References Cited

OTHER PUBLICATIONS

International Search Report mailed Nov. 12, 2013, issued for PCT/JP2013/073124.

* cited by examiner

EPOXY RESIN, CURABLE RESIN COMPOSITION, CURED PRODUCT THEREOF, AND PRINTED CIRCUIT BOARD

CROSS REFERENCE TO RELATED APPLICATIONS

This application is related to co-pending application: "EPDXY RESIN, CURABLE RESIN COMPOSITION, CURED PRODUCT THEREOF, AND PRINTED CIRCUIT BOARD" filed on Mar. 25, 2015 in the name of Yutaka Satou as a national phase entry of PCT/JP2013/073122, which application is assigned to the assignee of the present application and is incorporated by reference herein.

TECHNICAL FIELD

The present invention relates to an epoxy resin to be cured into a cured product which has a small change in heat resistance after receiving a thermal history and an excellent low thermal expansion property, the epoxy resin capable of being preferably used for a printed circuit board, a semiconductor sealing material, a coating material, a casting application, and the like; a curable resin composition simultaneously having those characteristics described above; a cured product thereof; and a printed circuit board.

BACKGROUND ART

Since a cured product obtained from an epoxy resin has excellent heat resistance and humidity resistance, besides applications for an adhesive, a molding material, a coating material, a photoresist material, a color developer, and the like, an epoxy resin has been widely used in electric and electronic fields including a semiconductor sealing material and a printed circuit-board insulating material.

In the printed circuit board field among the various applications described above, in concomitance with the trend toward reduction in size and improvement in performance of electronic apparatuses, the trend toward an increase in density by reduction in wiring pitch of semiconductor devices has been significant, and as a semiconductor mounting method corresponding to this trend, a flip chip connection method has been widely used in which a semiconductor device and a board are connected to each other with solder balls provided therebetween. Since this flip flop connection method is a semiconductor mounting method using a so-called reflow method in which after solder balls are disposed between a circuit board and a semiconductor device, melt welding is performed by heating the entire system, the circuit board itself is exposed to a high temperature environment during solder reflow, and a large stress is generated in the solder balls connecting the circuit board and the semiconductor device due to thermal contraction of the circuit board, so that a connection defect of wires may occur in some cases. Hence, as an insulating material used for printed circuit boards, a material having a low coefficient of thermal expansion has been demanded.

In addition, in recent years, because of regulations on environment issues and the like, a high melting point solder containing no lead has become a mainstream, and hence, the reflow temperature is increased. As a result, the change in heat resistance of an insulating material occurs during reflow, and a connection defect caused by warpage of a printed circuit board has become a serious problem. That is, a material having a small change in properties during reflow has been demanded.

In order to respond to the demand as described above, for example, a thermosetting resin composition containing as a main component, a naphthol novolac type epoxy resin obtained by a reaction between naphthol, formaldehyde, and epichlorohydrin has been proposed as a solution to achieve a technical subject such as a low temperature expansion property (see the following Patent Literature 1).

However, because of a high rigidity of the skeleton of the above naphthol novolac type epoxy resin as compared to that of a general phenol novolac type epoxy resin, although an effect of improving the coefficient of thermal expansion of a cured product to be obtained is observed, this improvement is not sufficient to satisfy the level which has been required in recent years. In addition, since the heat resistance of the cured product is remarkably changed due to a thermal history applied thereto, the change in heat resistance after reflow is large in the printed circuit board application, and hence, the above connection defect of a printed circuit board is liable to occur.

CITATION LIST

Patent Literature

PTL 1: Japanese Examined Patent Application Publication No. 62-20206

SUMMARY OF INVENTION

Technical Problem

Hence, an object of the present invention is to provide a curable resin composition, a cured product of which has a small change in heat resistance after receiving a thermal history and also shows a low thermal expansion property; a curd product of the curable resin composition; a printed circuit board having a small change in heat resistance after receiving a thermal history and an excellent low thermal expansion property; and an epoxy resin which can impart the characteristics described above.

Solution to Problem

Through intensive research carried out by the present inventors in order to achieve the above object, it was found that a cured product of an epoxy resin not only shows an excellent low thermal expansion property but also has a small change in heat resistance after receiving a thermal history because of an increase in reactivity of the epoxy resin itself, the epoxy resin being obtained by polyglycidyl etherification of a reaction product formed from ortho-cresol, a β-naphthol compound, and formaldehyde and containing a dimer of a β-naphthol compound, a trifunctional compound having a specific structure, and a tetrafunctional compound having a specific structure at a predetermined ratio. As a result, the present invention was made.

That is, the present invention relates to an epoxy resin which is obtained by polyglycidyl etherification of a reaction product formed from ortho-cresol, a β-naphthol compound, and formaldehyde and which comprises as a necessary component, a dimer (x2) represented by the following general formula (1)

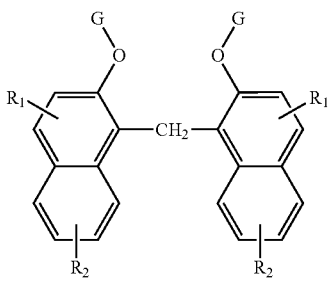

[Chem. 1]

(1)

(in the formula, $R^1$ and $R^2$ each independently represent a hydrogen atom, an alkyl group having 1 to 4 carbon atoms, or an alkoxy group having 1 to 4 carbon atoms, and G represents a glycidyl group);

a trifunctional compound (x3) represented by the following structural formula (2)

[Chem. 2]

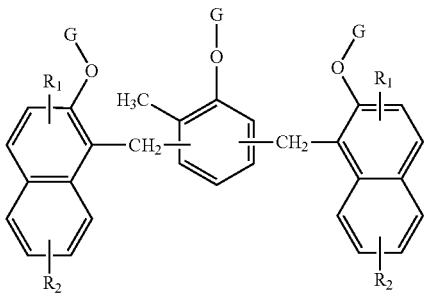

(2)

(in the formula, $R^1$ and $R^2$ each independently represent a hydrogen atom, an alkyl group having 1 to 4 carbon atoms, or an alkoxy group having 1 to 4 carbon atoms, and G represents a glycidyl group); and a tetrafunctional compound (x4) represented by the following structural formula (3)

[Chem. 3]

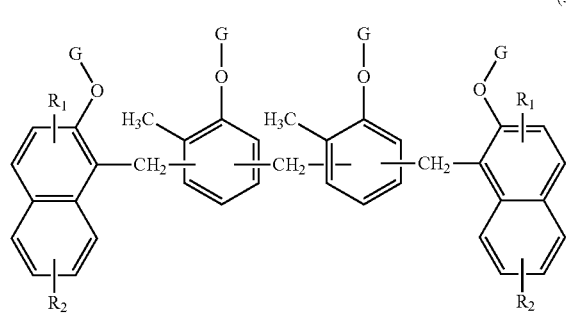

(3)

(in the formula, $R^1$ and $R^2$ each independently represent a hydrogen atom, an alkyl group having 1 to 4 carbon atoms, or an alkoxy group having 1 to 4 carbon atoms, and G represents a glycidyl group). In addition, in the epoxy resin described above, the total content of those components is 65% or more in terms of the area rate in GPC measurement.

The present invention further relates to a curable resin composition comprising as a necessary component, the epoxy resin described above and a curing agent.

The present invention further relates to a cured product obtained by a curing reaction of the curable resin composition described above.

The present invention further relates to a printed circuit board which is prepared by impregnating a reinforcing substrate with a varnish resin composition obtained by further blending an organic solvent with the curable resin composition described above, overlapping copper foil on the reinforcing substrate, and then performing heat pressure bonding.

Advantageous Effects of Invention

According to the present invention, there are provided a curable resin composition, a cured product of which has a small change in heat resistance after receiving a thermal history and which shows a low thermal expansion property; a curd product of the above curable resin composition; a printed circuit board having a small change in heat resistance after receiving a thermal history and an excellent low thermal expansion property; and an epoxy resin which imparts the characteristics described above.

DESCRIPTION OF EMBODIMENTS

Figure 1:
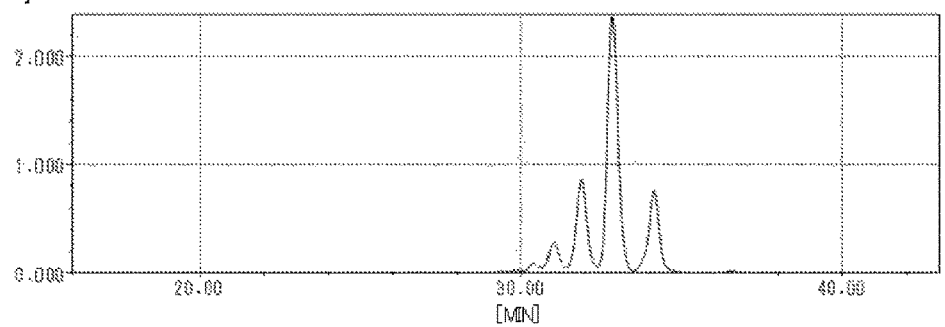
FIG. 1 is a GPC chart of a cresol-naphthol resin (a-1) obtained in Example 1.

Hereinafter, the present invention will be described in detail.

An epoxy resin of the present invention is an epoxy resin which is obtained by polyglycidyl etherification of a reaction product formed from ortho-cresol, a β-naphthol compound, and formaldehyde and which comprises as a necessary component, a dimer (x2) represented by the following structural formula (1)

[Chem. 4]

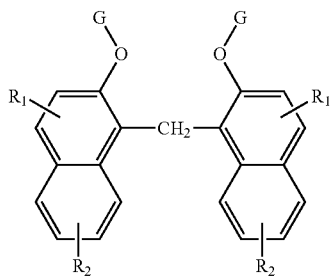

(1)

(in the formula, $R^1$ and $R^2$ each independently represent a hydrogen atom, an alkyl group having 1 to 4 carbon atoms, or an alkoxy group having 1 to 4 carbon atoms, and G represents a glycidyl group);

a trifunctional compound (x3) represented by the following structural formula (2)

[Chem. 5]

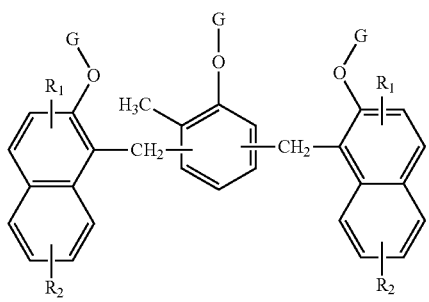

(2)

(in the formula, $R^1$ and $R^2$ each independently represent a hydrogen atom, an alkyl group having 1 to 4 carbon atoms, or an alkoxy group having 1 to 4 carbon atoms, and G represents a glycidyl group); and a tetrafunctional compound (x4) represented by the following structural formula (3)

[Chem. 6]

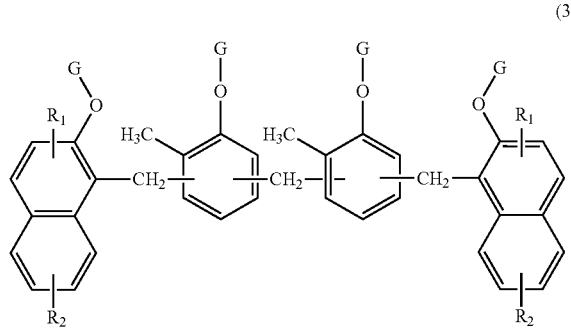

(3)

(in the formula, $R^1$ and $R^2$ each independently represent a hydrogen atom, an alkyl group having 1 to 4 carbon atoms, or an alkoxy group having 1 to 4 carbon atoms, and G represents a glycidyl group). In addition, in the epoxy resin described above, the total content of those components is 65% or more in terms of the area rate in GPC measurement.

That is, the epoxy resin of the present invention is a polycondensed polyglycidyl ether formed using as a raw material, ortho-cresol, a β-naphthol compound, and formaldehyde and is a mixture containing various resin structures, and in the mixture, the dimer (x2), the trifunctional compound (x3), and the tetrafunctional compound (x4) are contained at a high concentration of 65% or more in total.

Among those described above, since the tetrafunctional compound (x4) has a high content of a glycidyl group, and this glycidyl group itself also has a significantly high reactivity, when this compound is contained, a cured product having a higher cross-linking density is obtained, and hence, an effect of suppressing the change in heat resistance caused by a thermal history can be made more significant.

In addition, since having a cresol skeleton in its molecular structure, the trifunctional compound (x3) and the tetrafunctional compound (x4) each have an excellent solvent solubility and an effect of easily preparing a varnish; however, since the cresol skeleton itself has a poor orientation property, a cured product obtained therefrom has not an excellent low thermal expansion property. In the present invention, since the dimer (x2) is used together with the trifunctional compound (x3) and the tetrafunctional compound (x4), and the total content thereof is controlled to 65% or more in terms of the area rate in GPC measurement, varnish preparation can be easily performed without being disturbed, and an excellent low thermal expansion property can be realized. As described above, in the present invention, although the dimer (x2) is used which inherently has a high molecular orientation property and which is difficult to be used for varnish preparation, since the advantages, such as excellent solvent solubility of the trifunctional compound (x3) and the tetrafunctional compound (x4) and easy varnish preparation thereof, are used, varnish preparation can be easily performed, and in addition, an excellent low thermal expansion property can also be realized.

In the present invention, the total content of the dimer (x2), the trifunctional compound (x3), and the tetrafunctional compound (x4) is 65% or more in terms of the area rate in GPC measurement as described above, and when the total content is less than 65%, since the molecular orientation effect and the effect of excellent reactivity described above cannot be sufficiently obtained, a cured product having a high coefficient of thermal expansion and a large change in heat resistance after receiving a thermal history is obtained. In particular, since a cured product having a lower coefficient of thermal expansion and a smaller change in heat resistance after receiving a thermal history can be obtained, the total content of the dimer (x2), the trifunctional compound (x3), and the tetrafunctional compound (x4) is more preferably 70% or more.

In addition, since a cured product having an excellent solvent solubility and an excellent low thermal expansion property can be obtained, the content of the dimer (x2) in the epoxy resin of the present invention is preferably in a range of 5% to 40% in terms of the area rate in GPC measurement and more preferably in a range of 10% to 30%.

Since a cured product having an excellent low thermal expansion property and a small change in heat resistance after receiving a thermal history can be obtained, the content of the trifunctional compound (x3) in the epoxy resin of the present invention is preferably in a range of 25% to 70% in terms of the area rate in GPC measurement and more preferably in a range of 35% to 60%.

Since a cured product also having a small change in heat resistance after receiving a thermal history can be obtained, the content of the tetrafunctional compound (x4) in the epoxy resin of the present invention is preferably in a range of 10% to 40% in terms of the area rate in GPC measurement and more preferably in a range of 10% to 30%.

The contents of the dimer (x2), the trifunctional compound (x3), and the tetrafunctional compound (x4) in the epoxy resin of the present invention each indicate a presence rate calculated using GPC measurement performed under the following conditions, the presence rate being a rate of the peak area of each structure with respect to the total peak area of the epoxy resin of the present invention.

<GPC Measurement Conditions>

Measurement Apparatus: "HLC-8220 GPC" manufactured by Tosoh Corporation

Column: Guard Column "HXL-L" manufactured by Tosoh Corporation
+"TSK-GEL G2000HXL" manufactured by Tosoh Corporation
+"TSK-GEL G2000HXL" manufactured by Tosoh Corporation
+"TSK-GEL G3000HXL" manufactured by Tosoh Corporation
+"TSK-GEL G4000HXL" manufactured by Tosoh Corporation Detector: RI (Differential Refractometer)

Data Processing: "GPC-8020 model II version 4.10" manufactured by Tosoh Corporation Measurement Conditions:
Column Temperature 40° C.
Eluent Tetrahydrofuran
Flow Rate 1.0 ml/min Standard: In accordance with the measurement manual of the above "GPC-8020 model II version 4.10", the following monodisperse polystyrenes each having a predetermined molecular weight are used.

(Polystyrene Used as Standard)
"A-500" manufactured by Tosoh Corporation
"A-1000" manufactured by Tosoh Corporation
"A-2500" manufactured by Tosoh Corporation
"A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation Sample: A filtrate (50 μL) obtained by filtration using a microfilter from a tetrahydrofuran solution at a concentration of 1.0 percent by mass on a resin solid component basis.

In the structural formula (1) representing the dimer (x2), $R^1$ and $R^2$ each independently represent a hydrogen atom, an alkyl group having 1 to 4 carbon atoms, or an alkoxy group having 1 to 4 carbon atoms, and G represents a glycidyl group. In particular, as the dimer (x2) described above, the compounds represented by the following structural formulas (1-1) to (1-6) may be mentioned.

[Chem. 7]

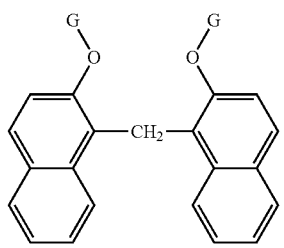

(1-1)

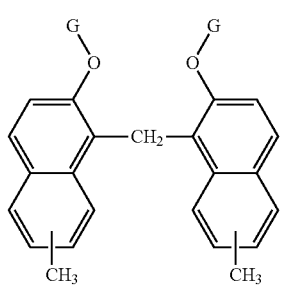

(1-2)

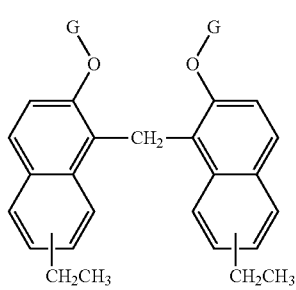

(1-3)

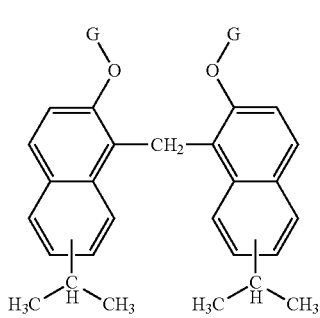

(1-4)

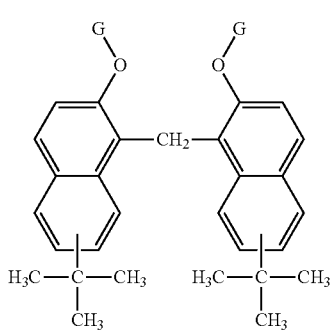

(1-5)

(1-6)

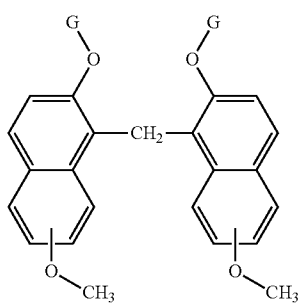

Among those mentioned above, the compound represented by the structural formula (1-1), that is, the compound in which R¹ and R² in the structural formula (1) each represent a hydrogen atom, is preferable since the coefficient of thermal expansion of a cured product thereof can be decreased.

In the structural formula (2) representing the trifunctional compound (x3) of the present invention, R¹ and R² each independently represent a hydrogen atom, an alkyl group having 1 to 4 carbon atoms, or an alkoxy group having 1 to 4 carbon atoms, and G represents a glycidyl group. In particular, as the trifunctional compound (x3) described above, the compounds represented by the following structural formulas (2-1) to (2-6) may be mentioned.

[Chem. 8]

(2-1)

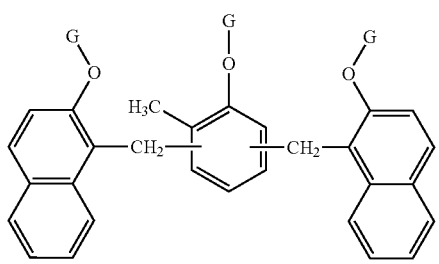

(2-2)

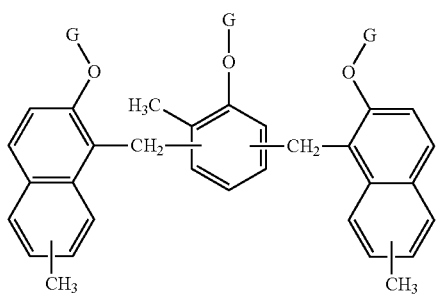

(2-3)

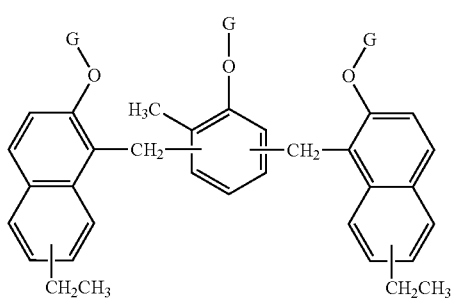

(2-4)

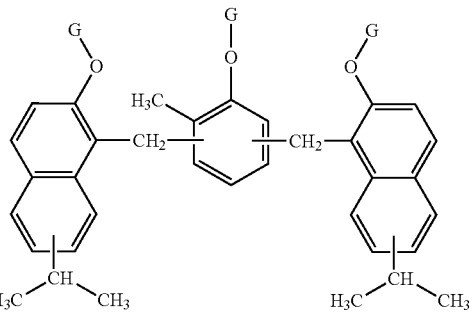

(2-5)

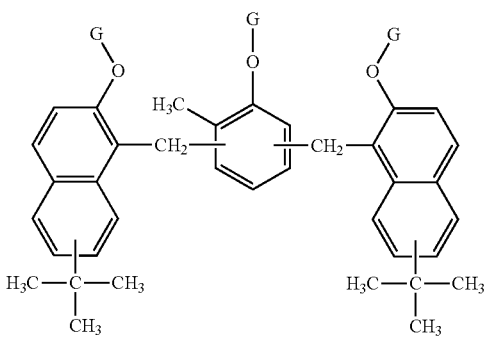

(2-6)

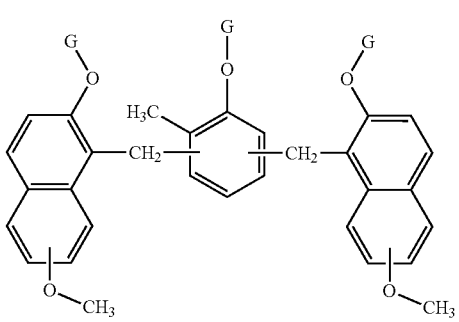

Among those mentioned above, the compound represented by the structural formula (2-1), that is, the compound in which R¹ and R² in the structural formula (2) each represent a hydrogen atom, is preferable since the coefficient of thermal expansion of a cured product thereof can be decreased.

In the structural formula (3) representing the tetrafunctional compound (x4) of the present invention, R¹ and R² each independently represent a hydrogen atom, an alkyl group having 1 to 4 carbon atoms, or an alkoxy group having 1 to 4 carbon atoms, and G represents a glycidyl group. In particular, as the tetrafunctional compound (x4) described above, the compounds represented by the following structural formulas (3-1) to (3-6) may be mentioned.

[Chem. 9]

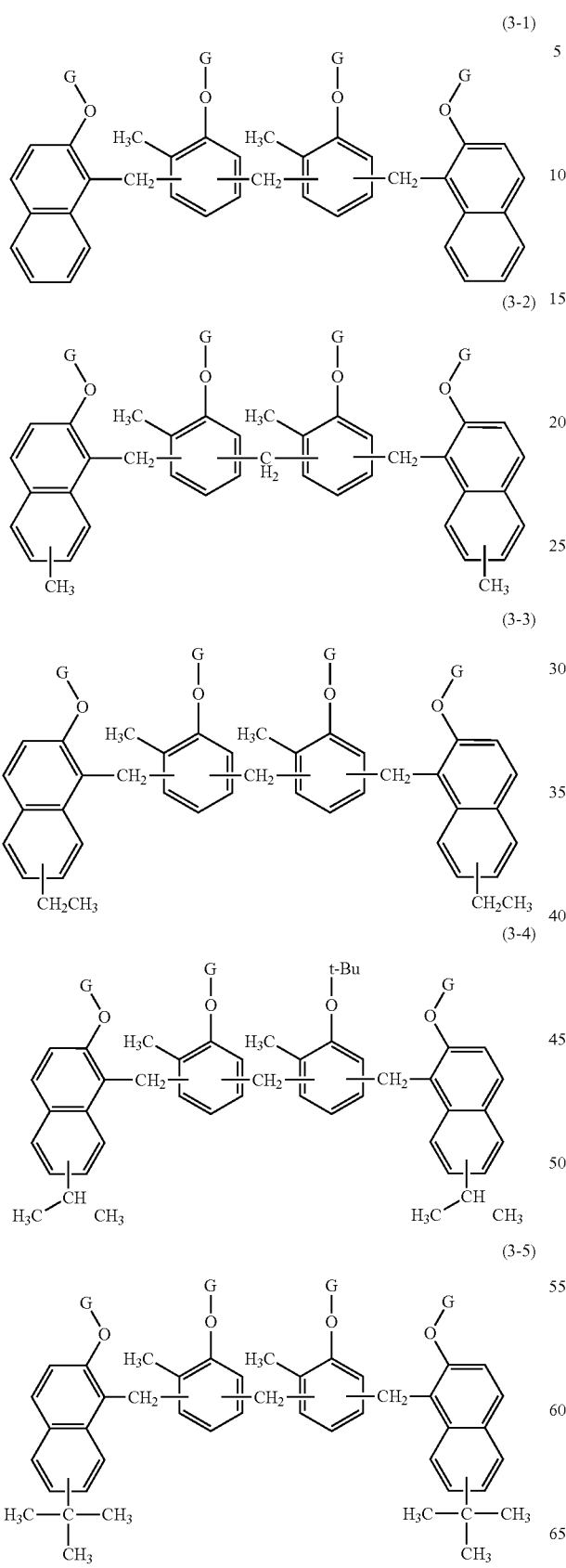

(3-1)
(3-2)
(3-3)
(3-4)
(3-5)

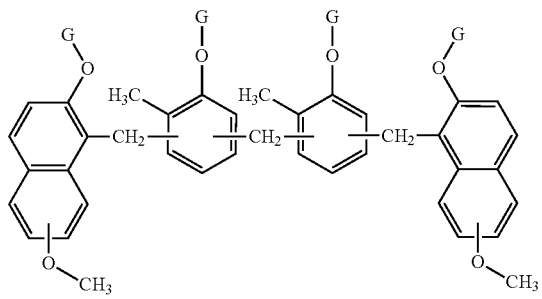

(3-6)

Among those mentioned above, the compound represented by the structural formula (3-1), that is, the compound in which $R^1$ and $R^2$ in the structural formula (3) each represent a hydrogen atom, is preferable since the coefficient of thermal expansion of a cured product thereof can be decreased.

Besides the dimer (x2), the trifunctional compound (x3), and the tetrafunctional compound (x4), the epoxy resin of the present invention may also contain another polyfunctional compound represented by the following structural formula (4) in which n represents 3 or more.

[Chem. 10]

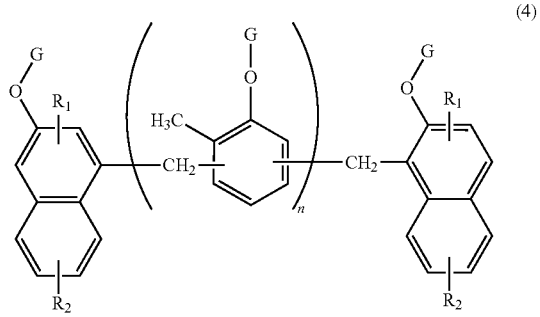

(4)

(in the formula, $R^1$ and $R^2$ each independently represent a hydrogen atom, an alkyl group having 1 to 4 carbon atoms, or an alkoxy group having 1 to 4 carbon atoms; G represents a glycidyl group; and n represents the number of repeating units and an integer of 3 or more).

In the epoxy resin of the present invention, when another polyfunctional compound represented by the above structural formula (4) in which n represents 3 or more is contained, since the curing of the present application invention in which the coefficient of thermal expansion and the change in heat resistance after receiving a thermal history of the cured product are further decreased can be sufficiently obtained, the total content of the dimer (x2), the trifunctional compound (x3), and the tetrafunctional compound (x4) is preferably 65% or more in terms of the area rate in GPC measurement, and in addition, the total content of the dimer (x2), the trifunctional compound (x3), the tetrafunctional compound (x4), and the polyfunctional compound (X) in which n represents any one of 3 to 5 is preferably 85% or more.

The epoxy resin of the present invention preferably has a softening point in a range of 70° C. to 100° C. since the solvent solubility of the epoxy resin itself is superior, and since a low thermal expansion property and a high solvent solubility can both be obtained, the softening point is particularly preferably in a range of 75° C. to 90° C.

In addition, the epoxy resin of the present invention preferably has an epoxy equivalent in a range of 220 to 300 g/eq since the low thermal expansion property of a cured product thereof is improved.

The epoxy resin of the present invention preferably has a molecular weight distribution (Mw/Mn) value in a range of 1.00 to 1.50 since the change in heat resistance after receiving a thermal history can also be decreased. In addition, the molecular weight distribution (Mw/Mn) of the present invention is a value calculated from the weight average molecular weight (Mw) and the number average molecular weight (Mn), each of which is measured under the conditions similar to those of the GPC measurement conditions used to obtain the content of each of the above components.

The epoxy resin of the present invention which has been described in detail may be manufactured, for example, by the following method 1 or 2.

Method 1: A method to obtain a target epoxy resin, comprising: performing a reaction between a β-naphthol compound and formaldehyde in the presence of an organic solvent and an alkaline catalyst, then performing a reaction by adding ortho-cresol in the presence of formaldehyde to obtain a cresol-naphthol resin (step 1), and then performing a reaction between an epihalohydrin and the cresol-naphthol resin thus obtained (step 2).

Method 2: A method to obtain a target epoxy resin, comprising: performing a reaction among ortho-cresol, a β-naphthol compound, and formaldehyde in the presence of an organic solvent and an alkaline catalyst to obtain a cresol-naphthol resin (step 1), and then performing a reaction between an epihalohydrin and the cresol-naphthol resin thus obtained (step 2).

In the present invention, in the step 1 of the above method 1 or 2, since the alkaline catalyst is used as a reaction catalyst, and a small amount the organic solvent is used as compared to that of the raw material components, the presence rates of the trifunctional compound (x3) and the dimer (x2) in the epoxy resin can be controlled in a predetermined range.

As the alkaline catalyst used in this case, for example, there may be mentioned an alkaline metal hydroxide, such as sodium hydroxide or potassium hydroxide, or an inorganic alkali, such as metal sodium, metal lithium, sodium hydride, sodium carbonate, or potassium carbonate. The usage thereof is preferably in a range of 0.01 to 2.0 times the total number of phenolic hydroxides of ortho-cresol and β-naphthol compound, each of which is the raw material component, on the molar basis.

In addition, as the organic solvent, for example, methyl cellosolve, isopropyl alcohol, ethyl cellosolve, toluene, xylene, or methyl isobutyl ketone may be mentioned. Among those mentioned above, since the polycondensed product has a relatively high molecular weight, isopropyl alcohol is particularly preferable. The usage of the organic solvent in the present invention is preferably in a range of 5 to 70 parts by mass with respect to 100 parts by mass of the total of ortho-cresol and a β-naphthol compound, each of which is the raw material component, since the presence rate of the trifunctional compound (x3) and that of the dimer (x2) in the epoxy resin can be easily controlled.

In the present invention, as a necessary raw material component, ortho-cresol is used. Among cresols, since ortho-cresol is used, the tetrafunctional compound (x4) and the trifunctional compound (x3) can be efficiently obtained, and a cured product of the epoxy resin to be obtained has a preferably low thermal expansion property.

As the β-naphthol compound which is the other necessary component in the present invention, for example, there may be mentioned β-naphthol or a β-naphthol compound in which the nucleus is substituted by an alkyl group, such as a methyl group, an ethyl group, a propyl group, or a t-butyl group, or an alkoxy group, such as a methoxy group or an ethoxy group. Among those mentioned above, β-naphthol having no substituent is preferable since a cured product of a finally obtained epoxy resin has a smaller change in heat resistance after receiving a thermal history.

In addition, formaldehyde used in the present invention may be either an aqueous formalin solution or a solid paraformaldehyde.

The usage ratio of ortho-cresol and a β-naphthol compound in the step 1 of the method 1 or 2 is preferably a molar ratio (ortho-cresol/β-naphthol compound) of 1/0.5 to 1/8 since each component ratio in the finally obtained epoxy resin can be easily controlled.

A reaction charge ratio of formaldehyde with respect to the total number of moles of ortho-cresol and a β-naphthol compound is preferably 0.6 to 2.0 times on the molar basis and particularly preferably 0.6 to 1.5 times since a superior low thermal expansion property is obtained.

In the step 1 of the method 1 described above, a target polycondensed product can be obtained by charging predetermined amounts of a β-naphthol compound, formaldehyde, an organic solvent, and an alkaline catalyst in a reaction chamber, then performing a reaction at 40° C. to 100° C., adding ortho-cresol (formaldehyde is further added, if necessary) after the reaction is completed, and further performing a reaction under a temperature condition of 40° C. to 100° C.

After the reaction of the step 1 is completed, a neutralizing treatment or a water washing treatment is performed until the pH of a reaction mixture reaches 4 to 7 after the completion of the reaction. The neutralizing treatment or the water washing treatment may be performed in accordance with a general method, and for example, an acidic material, such as acetic acid, phosphoric acid, or sodium phosphate, may be used as a neutralizer. After the neutralizing treatment or the water washing treatment is performed, the organic solvent is distilled out by heating at a reduced pressure, so that a target polycondensed product can be obtained.

In the step 1 of the method 2 described above, a target polycondensed product can be obtained by charging predetermined amounts of a β-naphthol compound, ortho-cresol, formaldehyde, an organic solvent, and an alkaline catalyst in a reaction chamber, and then performing a reaction at 40° C. to 100° C.

After the reaction in the step 1 is completed, a neutralizing treatment or a water washing treatment is performed until the pH of a reaction mixture reaches 4 to 7 after the completion of the reaction. The neutralizing treatment or the water washing treatment may be performed in accordance with a general method, and for example, an acidic material, such as acetic acid, phosphoric acid, or sodium phosphate, may be used as a neutralizer. After the neutralizing treatment or the water washing treatment is performed, the organic solvent is distilled out by heating at a reduced pressure, so that a target polycondensed product can be obtained.

Next, the step 2 of the above method 1 or 2 is a step of manufacturing a target epoxy resin by performing a reaction between the polycondensed product obtained in the step 1 and an epihalohydrin. As the step 2 described above, in particular, a method may be mentioned in which after an epihalohydrin in an amount of 2 to 10 times (molar basis) the number of moles of phenolic hydroxides in the polycondensed product is added thereto, a basic catalyst in an amount of 0.9 to 2.0 times (molar basis) the number of moles of phenolic hydroxides is added to the mixture prepared as described above at the same time or gradually, a reaction is performed at a temperature of 20° C. to 120° C. for 0.5 to 10 hours. This basic catalyst may be used in the form of a solid or an aqueous solution, and when an aqueous solution is used, a method may also be used in which while the aqueous solution is continuously added, water and an epihalohydrin are continuously distilled out from a reaction mixture at a reduced pressure or a normal pressure, and after water is removed by further performing liquid separation, an epihalohydrin is continuously returned to the reaction mixture.

In addition, in industrial production, although every epihalohydrin to be charged for a first batch of epoxy resin production is a new compound, from the following batch, an epihalohydrin recovered from a crude reaction product and a new epihalohydrin in an amount corresponding to that lost by consumption in the reaction are preferably used in combination. In this case, although an epihalohydrin to be used is not particularly limited, for example, epichlorohydrin, epibromohydrin, and β-methyl epichlorohydrin may be mentioned. Among those mentioned above, epichlorohydrin is preferable since being easily available from an industrial point of view.

In addition, as the basic catalyst described above, in particular, for example, there may be mentioned an alkaline earth metal hydroxide, an alkali metal carbonate, and an alkali metal hydroxide may be mentioned. In particular, since having an excellent catalyst activity in an epoxy resin synthesis reaction, an alkali metal hydroxide is preferable, and for example, sodium hydroxide or potassium hydroxide may be mentioned. When those basic catalysts are used, there may be used either a solid form or an aqueous solution at a concentration of approximately 10 to 55 percent by mass. In addition, when those basic catalysts are used in combination with an organic solvent, a synthetic reaction rate of an epoxy resin can be increased. Although the organic solvent as described above is not particularly limited, for example, there may be mentioned a ketone, such as acetone or methyl ethyl ketone; an alcohol compound, such as methanol, ethanol, 1-propyl alcohol, isopropyl alcohol, 1-butanol, secondary butanol, or tertiary butanol; a cellosolve, such as methyl cellosolve or ethyl cellosolve; an ether compound, such as tetrahydrofuran, 1,4-dioxane, 1,3-dioxane, or diethoxy ethane; or aprotic polar solvent, such as acetonitrile, dimethyl sulfoxide, or dimethylformamide. Those organic solvents may be used alone, or at least two types thereof may be used in combination in order to control the polarity.

After a reaction product of the above epoxidation reaction is washed with water, an unreacted epihalohydrin and the organic solvent used therewith are distilled out by heating at a reduced pressure. Furthermore, in order to obtain an epoxy resin having a small number of hydrolysable halogens, after the epoxy resin thus obtained is again dissolved in an organic solvent, such as toluene, methyl isobutyl ketone, or methyl ethyl ketone, a reaction may be further performed by addition of an aqueous solution containing an alkali metal hydroxide, sodium hydroxide or potassium hydroxide. In this case, in order to improve the reaction rate, a phase transfer catalyst, such as a quaternary ammonium salt or a crown ether, may also be used. When the phase transfer catalyst is used, the usage thereof is preferably set to 0.1 to 3.0 parts by mass with respect to 100 parts by mass of an epoxy resin to be used. After the reaction is completed, a salt generated thereby is removed by filtration, water washing, and/or the like, and the solvent, such as toluene or methyl isobutyl ketone, is further distilled out by heating at a reduced pressure, so that the target epoxy resin of the present invention can be obtained.

Next, the curable resin composition of the present invention includes as a necessary component, the epoxy resin described above in detail and a curding agent.

As the curing agent used in the present invention, for example, an amine compound, an amide compound, an acid anhydride compound, and a phenolic compound may be mentioned. In particular, as the amine compound, diaminodiphenylmethane, diethylenetriamine, triethylenetetramine, diaminodiphenyl sulfone, isophoronediamine, imidazole, a $BF_3$-amine complex, or a guanidine derivative may be mentioned; as the amide compound, dicyandiamide or a polyamide resin synthesized between ethylenediamine and a dimer of linolenic acid may be mentioned; and as the acid anhydride compound, for example, phthalic anhydride, trimellitic anhydride, pyromellitic anhydride, maleic anhydride, tetrahydrophthalic anhydride, methyl tetrahydrophthalic anhydride, methyl nadic anhydride, hexahydrophthalic anhydride, or methyl hexahydrophthalic anhydride may be mentioned. As the phenolic compound, for example, there may be mentioned a phenol novolac resin, a cresol novolac resin, an aromatic hydrocarbon formaldehyde resin-modified phenol resin, a dicyclopentadiene phenol adduct resin, a phenol aralkyl resin (Xylok resin), a polyvalent phenol novolac resin, such as a resorcinol novolac resin, synthesized from a polyvalent hydroxy compound and formaldehyde, a naphthol aralkyl resin, a trimethylolmethane resin, a tetraphenylolethane resin, a naphthol novolac resin, a naphthol-phenol co-condensation novolac resin, a naphthol-cresol co-condensation novolac resin, or a polyvalent phenol compound, such as a biphenyl-modified phenol resin (polyvalent phenol compound in which phenol nuclei are linked to each other with bismethylene groups provided therebetween), a biphenyl-modified naphthol resin (polyvalent naphthol compound in which phenol nuclei are linked to each other with bismethylene groups provided therebetween), an aminotriazine-modified phenol resin (polyvalent phenol compound in which phenol nuclei are linked to each other with melamine, benzoguanamine, or the like provided therebetween), or an alkoxy group-containing aromatic ring-modified novolac resin (polyvalent phenol compound in which phenol nuclei and alkoxy group-containing aromatic rings are linked to each other with formaldehyde provided therebetween).

Among those compounds mentioned above, a compound having a large number of aromatic skeletons in the molecular structure is particularly preferable in view of a low thermal expansion property, and in particular, a phenol novolac resin, a cresol novolac resin, an aromatic hydrocarbon formaldehyde resin-modified phenol resin, a phenol aralkyl resin, a resorcinol novolac resin, a naphthol aralkyl resin, a naphthol novolac resin, a naphthol-phenol co-condensation novolac resin, a naphthol-cresol co-condensation novolac resin, a biphenyl-modified phenol resin, a biphenyl-modified naphthol resin, an aminotriazine-modified phenol resin, or an alkoxy group-containing aromatic ring-modified novolac resin (polyvalent phenol compound in which phenol nuclei and alkoxy group-containing aromatic rings are linked to each other with formaldehyde provided therebetween) is preferable since having an excellent low thermal expansion property.

Although the amount of the epoxy resin and that of the curing agent in the curable resin composition of the present invention are not particularly limited, since cured product characteristics are preferable, with respect to one equivalent of the total epoxy group of the epoxy resin, the amount of the active group in the curing agent is preferably set to 0.7 to 1.5 equivalents.

In addition, if necessary, a curing promoter may also be appropriately used for the curable resin composition of the present invention. As the curing promoter mentioned above, although various materials may be used, for example, a phosphorous compound, a tertiary amine, an imidazole, an organic acid metal salt, a Lewis acid, and an amine complex salt may be mentioned. In particular, when the curable resin composition of the present invention is used in application for semiconductor sealing materials, since excellent curing properties, heat resistance, electrical characteristics, anti-humidity reliability, and the like can be obtained, triphenylphosphine as the phosphorous compound and 1,8-diazobicyclo-[5,4,0]-undecene (DBU) as the tertiary amine are preferable.

In the curable resin composition of the present invention, as the epoxy resin component, although the above epoxy resin of the present invention may only be used, another epoxy resin may also be used therewith so as not to degrade the effect of the present invention. In particular, with respect to the total mass of the epoxy resin components, 30 percent by mass or more of the epoxy resin of the present invention may be used together with another epoxy resin, and 40 percent by mass or more of the epoxy resin is preferable.

In the present invention, as the another epoxy resin to be used together with the above epoxy resin, although various epoxy resins may be used, for example, there may be mentioned a bisphenol A type epoxy resin, a bisphenol F type epoxy resin, a biphenyl type epoxy resin, a tetramethylbiphenyl type epoxy resin, a phenol novolac type epoxy resin, a cresol novolac type epoxy resin, a bisphenol A novolac type epoxy resin, a triphenylmethane type epoxy resin, a tetraphenylethane type epoxy resin, a dicyclopentadiene phenol addition reaction type epoxy resin, a phenol aralkyl type epoxy resin, a naphthol novolac type epoxy resin, a naphthol aralkyl type epoxy resin, a naphthol-phenol co-condensation novolac type epoxy resin, an aromatic hydrocarbon formaldehyde resin-modified phenol resin type epoxy resin, and a biphenyl novolac type epoxy resin.

Among those compounds mentioned above, since a cured product having an excellent heat resistance can be obtained, a phenol aralkyl type epoxy resin or a biphenyl novolac type epoxy resin; a naphthol novolac type epoxy resin, a naphthol aralkyl type epoxy resin, or a naphthol-phenol co-condensation novolac type epoxy resin, each of which has a naphthalene skeleton; a biphenyl type epoxy resin, a tetramethylbiphenyl type epoxy resin, or a xanthene type epoxy resin, each of which has a crystalline property; or an alkoxy group-containing aromatic ring-modified novolac type epoxy resin (compound in which glycidyl group-containing aromatic rings are linked to alkoxy group-containing aromatic rings with formaldehyde provided therebetween) is particularly preferable.

Since the curable resin composition of the present invention which has been described in detail has an excellent solvent solubility, an organic solvent may also be blended therewith besides the components described above. As the organic solvent which can be used in the present invention, for example, methyl ethyl ketone, acetone, dimethylformamide, methyl isobutyl ketone, methoxypropanol, cyclohexanone, methyl cellosolve, ethyl diglycol acetate, or propylene glycol monomethyl ether acetate may be mentioned. In addition, the selection of the solvent and an adequate usage thereof may be appropriately determined in accordance with its application; hence, for example, in application for printed circuit boards, a polar solvent, such as methyl ethyl ketone, acetone, or dimethylformamide, having a boiling point of 160° C. or less is preferably selected and is preferably used so as to contain 40 to 80 percent by mass of a nonvolatile component. In addition, in application for build-up purpose adhesive films, as the organic solvent, for example, a ketone, such as acetone, methyl ethyl ketone, or cyclohexanone; an acetate ester, such as ethyl acetate, butyl acetate, cellosolve acetate, propylene glycol monomethyl ether acetate, or carbitol acetate; a carbitol, such as cellosolve or butyl carbitol; an aromatic hydrocarbon, such as toluene or xylene; dimethylformamide, dimethylacetamide, or N-methyl pyrrolidone is preferably used so as to contain 30 to 60 percent by mass of a nonvolatile component.

In addition, in order to obtain flame retardancy, for example, in application for printed circuit boards, the curable resin composition described above may be blended with a non-halogen flame retardant substantially containing no halogen atoms so as not to degrade the reliability.

As the non-halogen flame retardant described above, for example, a phosphorus-based flame retardant, a nitrogen-based flame retardant, a silicone-based flame retardant, an inorganic-based flame retardant, and an organic metal salt-based flame retardant may be mentioned, and the use of those compounds may not be limited at all. Those compounds may be used alone, at least two flame retardants in the same category may be used in combination, or flame retardants in different categories may also be used in combination.

As the phosphorus-based flame retardant, either an inorganic-based compound or an organic-based compound may be used. As the inorganic-based compound, for example, red phosphorus, an ammonium phosphate, such as monoammonium phosphate, diammonium phosphate, triammonium phosphate, or ammonium polyphosphate; or an inorganic-based nitrogen-containing phosphorus compound, such as amide phosphate, may be mentioned.

In addition, the above red phosphorus is preferably surface-treated in order to prevent hydrolysis and the like, and as a surface treatment method, for example, there may be mentioned (i) a method in which a coating treatment is performed using an inorganic compound, such as magnesium hydroxide, aluminum hydroxide, zinc hydroxide, titanium hydroxide, bismuth oxide, bismuth hydroxide, bismuth nitrate, or a mixture thereof, (ii) a method in which a coating treatment is performed using a mixture containing an inorganic compound, such as magnesium hydroxide, aluminum hydroxide, zinc hydroxide, or titanium hydroxide, and a thermosetting resin such as a phenol resin, and (iii) a method in which a dual-coating treatment is performed by applying a thermosetting resin such as a phenol resin over a coating film of an inorganic compound, such as magnesium hydroxide, aluminum hydroxide, zinc hydroxide, or titanium hydroxide.

As the organic phosphorus-based compound, for example, besides a phosphate ester compound, a phosphonic acid compound, a phosphine compound, a phosphine oxide compound, a phosphorane compound, and a common organic phosphorus-based compound such as an organic-based nitrogen-containing phosphorus compound, for example, there may be mentioned a cyclic organic phosphorus compound, such as 9,10-dihydro-9-oxa-10-phosphaphenanthrene-10-oxide, 10-(2,5-dihydrooxyphenyl)-10H-

9-oxa-10-phosphaphenanthrene-10-oxide, 10-(2,7-dihydrooxynaphtyl)-10H-9-oxa-10-phosphaphenanthrene-10-oxide, and a derivative obtained therefrom by a reaction with a compound, such as an epoxy resin or a phenol resin.

Although the content thereof to be blended is appropriately selected in accordance with the type of phosphorus-based flame retardant, the other components of the curable resin composition, and the degree of desired flame retardancy, for example, in 100 parts by mass of the curable resin composition in which the epoxy resin, the curing agent, the non-halogen flame retardant, and the other fillers and additives are all blended together, when red phosphorus is used as the non-halogen flame retardant, the content thereof is preferably set in a range of 0.1 to 2.0 parts by mass, and when an organic phosphorus compound is used, the content thereof is also preferably set in a range of 0.1 to 10.0 parts by mass and particularly preferably set in a range of 0.5 to 6.0 parts by mass.

In addition, when the phosphorus-based flame retardant is used, hydrotalcite, magnesium hydroxide, a boron compound, zirconium oxide, a black dye, calcium carbonate, zeolite, zinc molybdate, and/or active carbon may also be used together with the phosphorus-based flame retardant.

As the nitrogen-based flame retardant, for example, there may be mentioned a triazine compound, a cyanuric acid compound, an isocyanuric acid compound, and phenothiazine may be mentioned, and a triazine compound, a cyanuric acid compound, and an isocyanuric acid compound are preferable.

As the triazine compound, for example, besides melamine, acetoguanamine, benzoguanamine, mellon, melam, succinoguanamine, ethylenedimelamine, melamine polyphosphate, and triguanamine, for example, there may be mentioned (i) an aminotriazine sulfate compound, such as guanylmelamine sulfate, melem sulfate, or melam sulfate; (ii) a co-condensed product among a phenol, such as phenol, cresol, xylenol, butylphenol, or nonylphenol, a melamine, such as melamine, benzoguanamine, acetoguanamine, or formguanamine, and formaldehyde; (iii) a mixture of the above co-condensed product (ii) and a phenol resin such as a phenol-formaldehyde condensed product; and (iv) a product obtained by further modifying the above (ii) and/or (iii) with a wood oil or an isomerized linseed oil.

As particular examples of the cyanuric acid compound, for example, cyanuric acid and melamine cyanurate may be mentioned.

Although the content of the nitrogen-containing flame retardant to be blended is appropriately selected in accordance with the type of nitrogen-containing flame retardant, the other components of the curable resin composition, and the degree of desired flame retardancy, for example, in 100 parts by mass of the curable resin composition in which the epoxy resin, the curing agent, the non-halogen flame retardant, and the other fillers and additives are all blended together, the content is preferably set in a range of 0.05 to 10 parts by mass and is particularly preferably set in a range of 0.1 to 5 parts by mass.

In addition, when the nitrogen-containing flame retardant is used, for example, a metal hydroxide and/or a molybdenum compound may be used together therewith.

As the silicone-based flame retardant described above, although any organic compound containing a silicon atom may be used without any particular limitation, for example, a silicone oil, a silicone rubber, or a silicone resin may be mentioned.

Although the content of the silicone-based flame retardant to be blended is appropriately selected in accordance with the type of silicone-based flame retardant, the other components of the curable resin composition, and the degree of desired flame retardancy, for example, in 100 parts by mass of the curable resin composition in which the epoxy resin, the curing agent, the non-halogen flame retardant, and the other fillers and additives are all blended together, the content is preferably set in a range of 0.05 to 20 parts by mass. In addition, when the silicone-based flame retardant is used, for example, a molybdenum compound and/or alumina may also be used together therewith.

As the inorganic-based flame retardant, for example, a metal hydroxide, a metal oxide, a metal carbonate compound, a metal powder, a boron compound, and a low-melting point glass may be mentioned.

As particular examples of the metal hydroxide, for example, there may be mentioned aluminum hydroxide, magnesium hydroxide, dolomite, hydrotalcite, calcium hydroxide, barium hydroxide, and zirconium hydroxide.

As particular examples of the metal oxide, for example, there may be mentioned zinc molybdate, molybdenum trioxide, zinc stannate, tin oxide, aluminum oxide, iron oxide, titanium oxide, manganese oxide, zirconium oxide, zinc oxide, molybdenum oxide, cobalt oxide, bismuth oxide, chromium oxide, nickel oxide, copper oxide, and tungsten oxide.

As particular examples of the metal carbonate, for example, there may be mentioned zinc carbonate, magnesium carbonate, calcium carbonate, barium carbonate, basic magnesium carbonate, aluminum carbonate, ferrous carbonate, cobalt carbonate, and titanium carbonate.

As particular examples of the metal powder, for example, there may be mentioned aluminum, iron, titanium, manganese, zinc, molybdenum, cobalt, bismuth, chromium, nickel, copper, tungsten, and tin.

As particular examples of the boron compound, for example, there may be mentioned zinc borate, zinc metaborate, barium metaborate, boric acid, and borax.

As particular examples of the low melting-point glass, for example, there may be mentioned Shipuri (Bokusui Brown Co., Ltd.), a hydrated glass $SiO_2$—MgO—$H_2O$, a PbO—$B_2O_3$-based, a ZnO—$P_2O_5$—MgO-based, a $P_2O_5$—$B_2O_2$—PbO—MgO-based, a P—Sn—O—F-based, a PbO—$V_2O_5$—$TeO_2$-based, an $Al_2O_2$—$H_2O$-based, and a borosilicate lead-based glassy compound.

Although the content of the inorganic-based flame retardant to be blended is appropriately selected in accordance with the type of inorganic-based flame retardant, the other components of the curable resin composition, and the degree of desired flame retardancy, for example, in 100 parts by mass of the curable resin composition in which the epoxy resin, the curing agent, the non-halogen flame retardant, and the other fillers and additives are all blended together, the content is preferably set in a range of 0.05 to 20 parts by mass and particularly preferably set in a range of 0.5 to 15 percent by mass.

As the above organic metal salt-based flame retardant, for example, there may be mentioned ferrocene, an acetylacetonate metal complex, an organic metal carbonyl compound, an organic cobalt salt compound, an organic metal sulfonate, and a compound in which a metal atom is ion bonded or coordinate bonded to an aromatic compound or a heterocyclic compound.

Although the content of the organic metal salt-based flame retardant to be blended is appropriately selected in accordance with the type of organic metal salt-based flame retardant, the other components of the curable resin composition, and the degree of desired flame retardancy, for example, in 100 parts by mass of the curable resin composition in which the epoxy resin, the curing agent, the non-halogen flame retardant, and the other fillers and additives are all blended together, the content is preferably set in a range of 0.005 to 10 parts by mass.

In the curable resin composition of the present invention, if necessary, an inorganic filler material may be blended therein. As the inorganic filler material, for example, fused silica, crystalline silica, alumina, silicon nitride, and aluminum hydroxide may be mentioned. When the content of the inorganic filler material to be blended is particularly increased, fused silica is preferably used. Although either crushed or spherical fused silica may be used, in order to increase the content thereof to be blended and to suppress the increase in melt viscosity of a molding material, spherical silica is preferably mainly used. Furthermore, in order to increase the content of spherical silica to be blended, the particle size distribution thereof is preferably appropriately adjusted. The filling rate thereof is preferably set to high in consideration of the flame retardancy, and a content of 20 percent by mass or more is preferable with respect to the total amount of the curable resin composition. In addition, when used in application for an electrically conductive paste, an electrically conductive filling material, such as a silver powder or a copper powder, may be used.

To the curable resin composition of the present invention, if necessary, various additives, such as a silane coupling agent, a release agent, a pigment, and/or an emulsifier, may be added.

The curable resin composition of the present invention may be obtained by uniformly blending the components described above with each other. The curable resin composition of the present invention in which the epoxy resin of the present invention and the curing agent are blended together with, if necessary, a curing promoter can be easily formed into a cured product by a method similar to the method which has been known in the past. As the cured product, a molded cured product in the form of a laminate, a cast article, an adhesive layer, a coating film, a film, or the like may be mentioned.

As the application in which the curable resin composition of the present invention is used, for example, a printed circuit board material, a resin casting material, an adhesive, an interlayer insulating material for build-up boards, and a build-up purpose adhesive film may be mentioned. In addition, among those various applications, in the applications for a printed circuit board, an electronic circuit board insulating material, and a build-up purpose adhesive film, as an insulating material for a so-called electronic component-embedding board in which a passive component such as a capacitor and/or an active component such as an IC chip is embedded, the curable resin composition of the present invention may be used. Among those applications, since having a small change in heat resistance after receiving a thermal history, a low thermal expansion property, and solvent solubility, the curable resin composition of the present invention is preferably used for a printed circuit board material and/or a build-up purpose adhesive film.

In order to manufacture a printed circuit board from the curable resin composition of the present invention, a method may be mentioned in which after a reinforcing substrate is impregnated with a varnish curable resin composition containing the organic solvent described above, copper foil is overlapped on the reinforcing substrate, and heat pressure bonding is then performed. As the reinforcing substrate usable in this method, for example, paper, glass cloth, glass nonwoven cloth, aramid paper, aramid cloth, glass mat, glass roving cloth, and the like may be mentioned. The above method will be described in more detail. First, the above varnish curable resin composition is heated at a heating temperature in accordance with the type of solvent to be used or preferably at 50° C. to 170° C., so that a cured product in the form of prepregs is obtained. Although the mass ratio of the resin composition used in this case to the reinforcing substrate is not particularly limited, in general, the resin component in the prepreg is preferably controlled to 20 to 60 percent by mass. Next, after the prepregs obtained as described above are laminated to each other by a general method, and copper foil is appropriately overlapped thereon, heat pressure bonding is performed at 170° C. to 250° C. for 10 minutes to 3 hours at a pressure of 1 to 10 MPa, so that a target printed circuit board can be obtained.

When the curable resin composition of the present invention is used as a resist ink, for example, a method may be mentioned in which as a curing agent of the curable resin composition, a cationic polymerization catalyst is used, and after a resist ink composition is formed by further adding a pigment, talk, and a filler, this resist ink composition is applied on a printed circuit board by a screen printing method and is then formed into a resist ink cured product.

When the curable resin composition of the present invention is used as an electrically conductive paste, for example, there may be mentioned a method to form an isotropic electrically conductive composition by dispersing fine electrically conductive particles in the curable resin composition and a method to form a circuit connection paste resin composition or an isotropic electrically conductive adhesive, each of which is liquid at room temperature.

As a method to obtain an interlayer insulating material for build-up boards from the curable resin composition of the present invention, for example, after the curable resin composition which is appropriately blended with a rubber, a filler, and/or the like is applied by a spray coating method, a curtain coating method, or the like to a circuit board on which a circuit is formed, curing is performed. Subsequently, after holes, such as predetermined through-hole portions, are formed if necessary, a treatment is performed with a roughing agent, and the surface is then washed with hot water to form irregularities, followed by performing a metal plating treatment using copper or the like. As the plating method described above, an electroless plating treatment and an electrolytic plating treatment are preferable, and as the roughing agent described above, for example, an oxidizing agent, an alkali, and an organic solvent may be mentioned. The operations as described above are sequentially repeated as desired to alternately build up a resin insulating layer and an electrically conductive layer having a predetermined pattern, so that a build-up board is obtained. However, hole formation of through-hole portions is performed after the outermost resin insulating layer is formed. In addition, when copper foil provided with a resin which is the curable resin composition in a semi-cured state is heat pressure bonded to a circuit board having a circuit thereon at 170° C. to 250° C., a build-up board can be formed without forming a roughened surface and performing a plating treatment.

As a method for manufacturing a build-up purpose adhesive film from the curable resin composition of the present invention, for example, a method may be mentioned in which the curable resin composition of the present invention is applied on a support film to form a resin composition layer as an adhesive film for multilayer printed circuit boards.

When the curable resin composition of the present invention is used for a build-up purpose adhesive film, it is important that the adhesive film be softened under a laminate temperature condition (generally, 70° C. to 140° C.) in a vacuum lamination method and simultaneously show fluidity (resin flow) when lamination is performed on a circuit board so as to fill via holes or through-holes formed therein, and in order to realize the characteristics as described above, the individual components described above are preferably blended together.

In this case, in general, the through-hole in a multilayer printed circuit board has a diameter of 0.1 to 0.5 mm and a depth of 0.1 to 1.2 mm, and in general, resin filling is preferably performed in the range described above. In addition, when lamination is performed on two surfaces of a circuit board, approximately one half of the through-hole is preferably filled.

As a method for manufacturing the adhesive film described above, in particular, manufacturing may be performed in such a way that after the varnish curable resin composition of the present invention is prepared and then applied to the surface of a support film (Y), a layer (X) of the curable resin composition is formed by drying an organic solvent by heating or hot wind blowing.

The thickness of the layer (X) thus formed is generally set to not less than the thickness of an electrically conductive layer. Since the thickness of the electrically conductive layer of the circuit board is generally in a range of 5 to 70 µm, the thickness of the resin composition layer is preferably set to 10 to 100 µm.

In addition, the layer (X) of the present invention may be protected by a protective film which will be described later. Because of the protection by the protective film, the surface of the resin composition layer is protected from adhesion of dust or the like and being scratched.

As the support film and the protective film described above, for example, there may be mentioned a polyolefin, such as a polyethylene, a polypropylene, or a poly(vinyl chloride); a polyester, such as a poly(ethylene terephthalate) (hereinafter abbreviated as "PET" in some cases) or a poly(ethylene naphthalate); a polycarbonate; a polyimide; release paper, or metal foil, such as copper foil or aluminum foil. In addition, the support film and the protective film each may be processed by a release treatment besides a mud treatment and/or a corona treatment.

Although the thickness of the support film is not particularly limited, the thickness is generally 10 to 150 µm and preferably 25 to 50 µm. In addition, the thickness of the protective film is preferably set to 1 to 40 µm.

After lamination is performed on the circuit board, or an insulating layer is formed by heat curing, the support film (Y) described above is peeled away. When the support film (Y) is peeled away after the adhesive film is heat cured, adhesion of dust or the like can be prevented in a curing step. When peeling is performed after the curing, in general, a release treatment is performed on the support film in advance.

Next, a method for manufacturing a multilayer printed circuit board using the adhesive film obtained as described above is performed, for example, in such a way that when the layer (X) is protected by the protective film, after the protective film is removed, the layer (X) is laminated on at least one surface of a circuit board, for example, by a vacuum lamination method so that the layer (X) is directly brought into contact with the circuit board. The lamination method may be either a batch method or a continuous method using a roller. In addition, before the lamination is performed, the adhesive film and the circuit board may be heated (pre-heated) in advance, if necessary.

The lamination is preferably performed under the following lamination conditions. That is, a pressure bonding temperature (lamination temperature) is preferably set to 70° C. to 140° C., a pressure bonding pressure is preferably set to 1 to 11 kgf/cm$^2$ (9.8×104 to 107.9×10$^4$ N/m$^2$), and an air pressure is preferably set to a reduced pressure of 20 mmHg (26.7 hPa) or less.

A method to obtain the cured product of the present invention may be performed in accordance with a general method for curing a curable resin composition, and for example, heating temperature conditions may be appropriately selected in accordance with the types of curing agents to be used in combination, the application, and the like; however, the composition obtained by the method described above may be heated in a temperature range of approximately 20° C. to 250° C.

Hence, by the use of the epoxy resin described above, the solvent solubility thereof is significantly improved, and when a cured product is formed therefrom, a small change in heat resistance after a thermal history and a low thermal expansion property can be obtained; hence, the epoxy resin described above can be applied to a leading-edge printed circuit board. In addition, the epoxy resin described above can be easily and efficiently manufactured by the manufacturing method of the present invention, and a molecular design can be performed in accordance with the level of the target performance described above.

EXAMPLES

Next, the present invention will be described in detail with reference to Examples and Comparative Examples, and the following "part(s)" and "%" are each on the mass basis unless particularly noted otherwise. In addition, the softening point, GPC, NMR, and MS spectra were measured under the following conditions.

1) Softening point measurement method: JIS K7234
2) GPC: Measurement conditions are as shown below.
  Measurement Apparatus: "HLC-8220 GPC" manufactured by Tosoh Corporation
  Column: Guard Column "HXL-L" manufactured by Tosoh Corporation
  +"TSK-GEL G2000HXL" manufactured by Tosoh Corporation
  +"TSK-GEL G2000HXL" manufactured by Tosoh Corporation
  +"TSK-GEL G3000HXL" manufactured by Tosoh Corporation
  +"TSK-GEL G4000HXL" manufactured by Tosoh Corporation
  Detector: RI (Differential Refractometer)
  Data Processing: "GPC-8020 model II version 4.10" manufactured by Tosoh Corporation
  Measurement Conditions:
  Column Temperature 40° C.
  Eluent Tetrahydrofuran
  Flow Rate 1.0 ml/min
  Standard: In accordance with the measurement manual of the above "GPC-8020 model II version 4.10", the following monodisperse polystyrenes each having a predetermined molecular weight were used.
  (Polystyrene Used as Standard)
  "A-500" manufactured by Tosoh Corporation
  "A-1000" manufactured by Tosoh Corporation
  "A-2500" manufactured by Tosoh Corporation "A-5000" manufactured by Tosoh Corporation
"F-1" manufactured by Tosoh Corporation
"F-2" manufactured by Tosoh Corporation
"F-4" manufactured by Tosoh Corporation
"F-10" manufactured by Tosoh Corporation
"F-20" manufactured by Tosoh Corporation
"F-40" manufactured by Tosoh Corporation
"F-80" manufactured by Tosoh Corporation
"F-128" manufactured by Tosoh Corporation Sample: A filtrate (50 µL) obtained by microfilter filtration of a tetrahydrofuran solution at a concentration of 1.0 percent by mass on a resin solid component basis.

3) $^{13}$C-NMR: Measurement conditions are as shown below.

Apparatus: "JNM-ECA500" manufactured by JEOL
Measurement mode: SGNNE (NOE-suppressed 1H complete decoupling method)
Solvent: dimethyl sulfoxide
Pulse angle: 45° pulse
Sample concentration: 30 percent by weight
Cumulative number: 10,000 times 4) MS: JMS-T100GC manufactured by JEOL

Example 1

To a flask equipped with a thermometer, a dripping funnel, a condenser, a fractionating column, and a stirrer, 216 parts by mass (1.5 moles) of β-naphthol, 250 parts by mass of isopropyl alcohol, 122 parts by mass (1.50 moles) of a 37%-formaline aqueous solution, and 31 parts by mass (0.38 moles) of 49%-sodium hydroxide were charged and then heated from room temperature to 75° C. while being stirred, and subsequently, stirring was performed at 75° C. for 1 hour. Next, 81 parts by mass (0.75 moles) of ortho-cresol was charged, and stirring was further performed at 75° C. for 8 hours. After the reaction was completed, neutralization was performed by addition of 45 parts by mass of primary sodium phosphate, and 630 parts by mass of methyl isobutyl ketone was then added. After washing was performed 3 times with 158 parts by mass of water, drying was performed by heating at a reduced pressure, so that 290 parts by mass of a cresol-naphthol resin (a-1) was obtained. A GPC chart of the cresol-naphthol resin (a-1) thus obtained is shown in FIG. 1. The hydroxide equivalent of the cresol-naphthol resin (a-1) was 140 g/equivalent, and the content of a trifunctional compound represented by the following structural formula (a), which was calculated from a GPC chart, was 51.5%.

[Chem. 11]

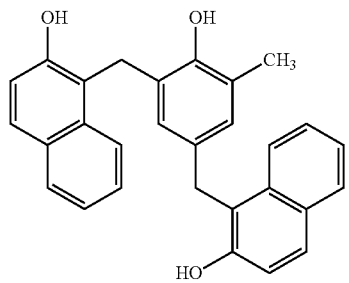

(a)

Figure 2:
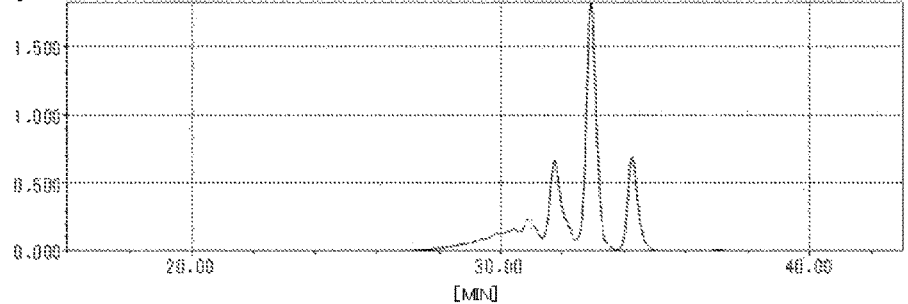
FIG. 2 is a GPC chart of an epoxy resin (A-1) obtained in Example 1.
Figure 3:
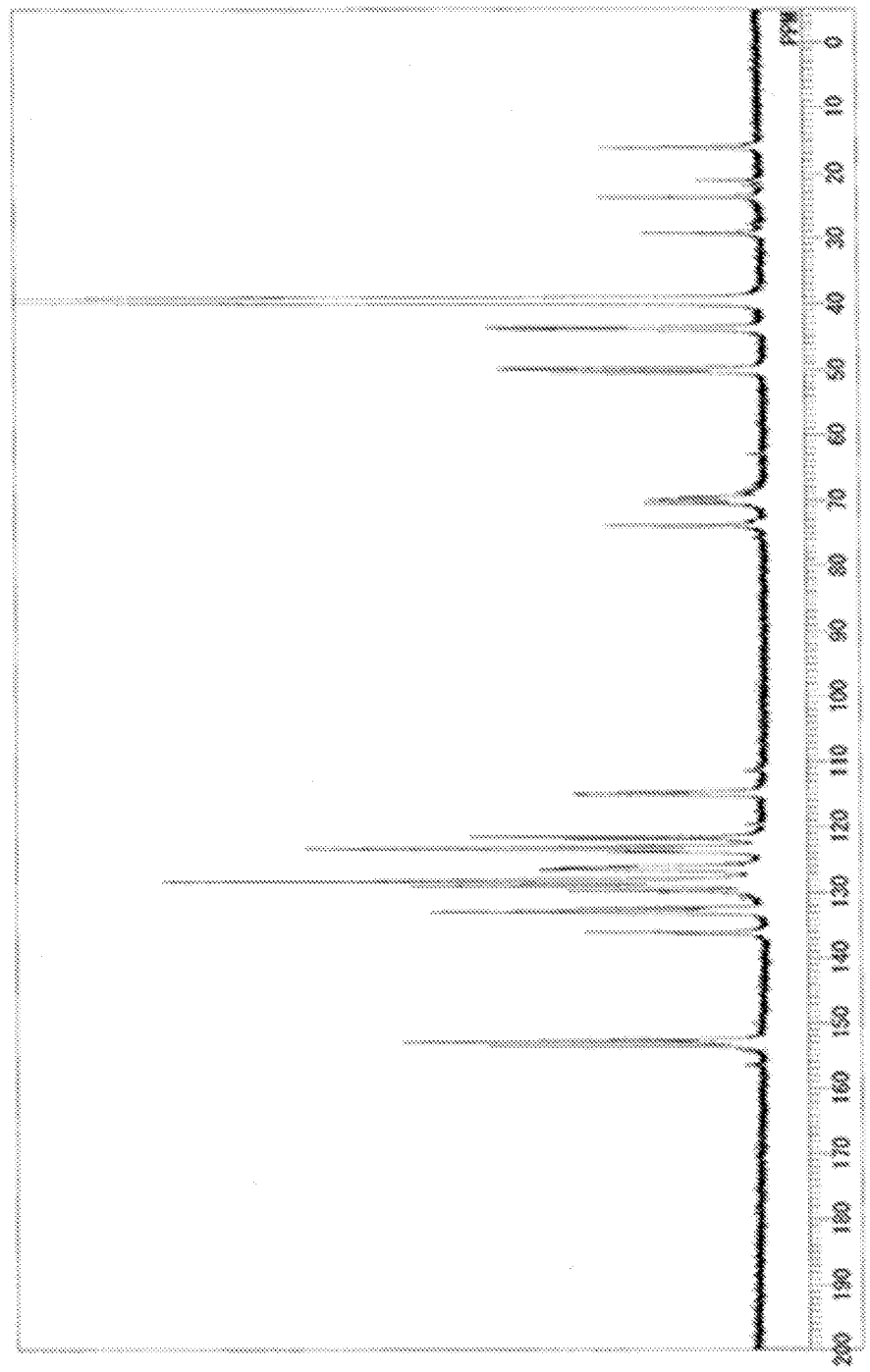
FIG. 3 is a $C^{13}$ NMR chart of the epoxy resin (A-1) obtained in Example 1.
Figure 4:
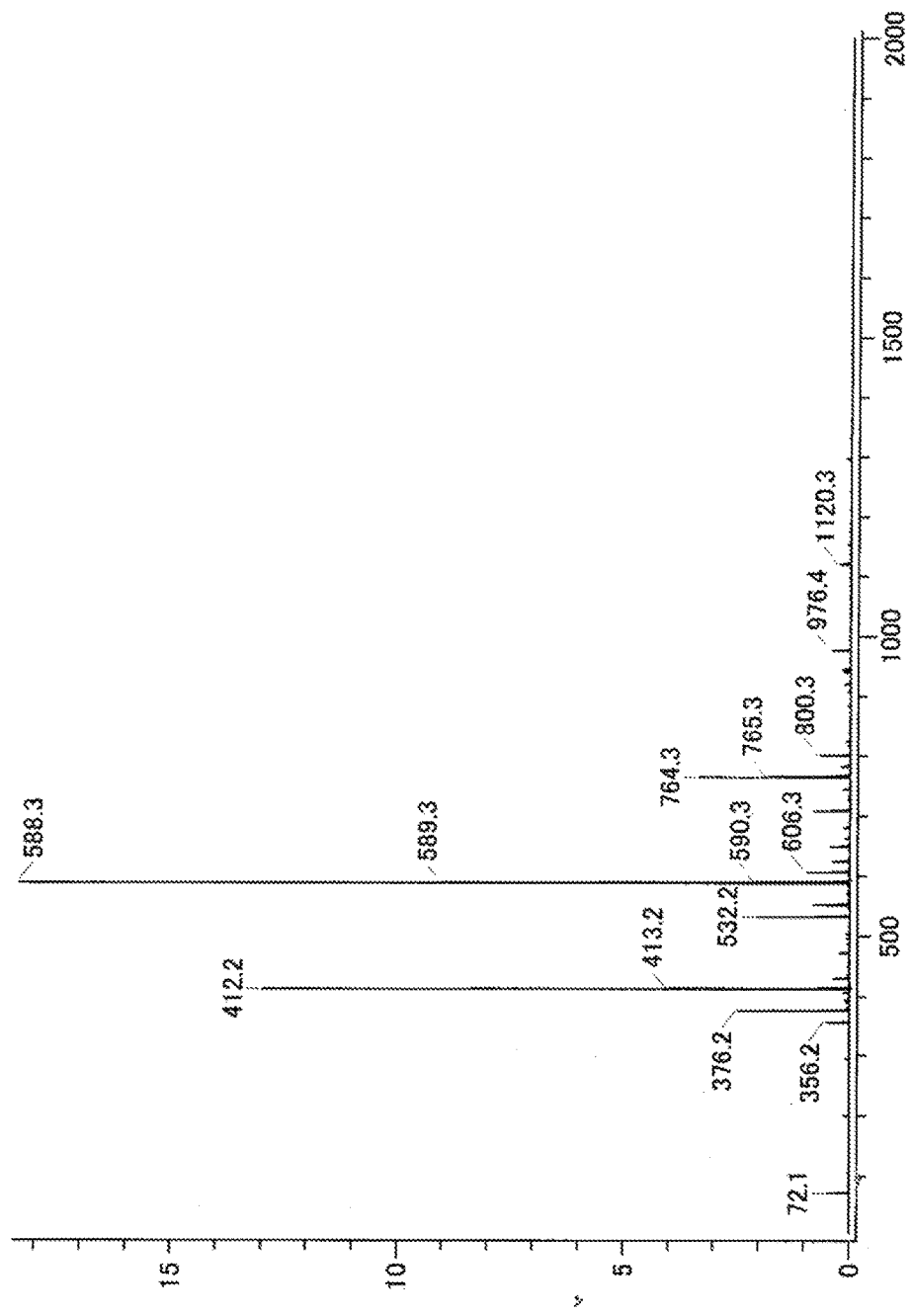
FIG. 4 is an MS spectrum of the epoxy resin (A-1) obtained in Example 1.

Next, while nitrogen gas purge is performed, to a flask equipped with a thermometer, a condenser, and a stirrer, 140 parts by mass (1.0 hydroxide equivalent) of the cresol-naphthol resin (a-1) obtained by the reaction described above, 463 parts by mass (5.0 moles) of epichlorohydrin, and 53 parts by mass of n-butanol were charged and were dissolved to each other while being stirred. After the mixture thus obtained was heated to 50° C., 220 parts by mass (1.10 moles) of 20%-sodium hydroxide aqueous solution was added over 3 hours, and subsequently, a reaction was further performed at 50° C. for 1 hour. After the reaction was completed, stirring was stopped, a water layer separated as a lower layer is removed. Subsequently, stirring was again started, and unreacted epichlorohydrin was distilled out at 150° C. at a reduced pressure. By addition of 300 parts by mass of methyl isobutyl ketone and 50 parts by mass of n-butanol to a crude epoxy resin thus obtained, a solution was prepared. Furthermore, after 15 parts by mass of 10%-sodium hydroxide aqueous solution was added to this solution, and a reaction was performed at 80° C. for 2 hours, water washing with 100 parts by mass of water was repeatedly performed three times until the pH of washing water reached neutral. Next, after the system was dehydrated by azeotropy, and microfiltration was performed, the solvents were distilled out at a reduced pressure, and as a result, 192 parts by mass of a target epoxy resin (A-1) was obtained. A GPC chart, an NMR chart, and an MS spectrum of the epoxy resin (A-1) thus obtained are shown in FIGS. 2, 3, and 4, respectively. The epoxy equivalent, the softening point, and the molecular weight distribution (Mw/Mn) of the epoxy resin (A-1) were 227 g/equivalent, 78° C., and 1.25, respectively. The content of a component corresponding to the above dimer (x2), the content of a component corresponding to the trifunctional compound (x3) represented by the following structural formula (b), and the content of a component corresponding to the tetrafunctional compound (x4), each of which was calculated from the GPC chart, were 16.1%, 42.0%, and 19.7%, respectively, and the total content thereof was 77.8%. In addition, the total content of the dimer (x2), the trifunctional compound (x3), the tetrafunctional compound (x4), and the polyfunctional compound (X) in which n represents any one of 3 to 5 was 91.4%. From the MS spectrum, a peak of 588 indicating a trifunctional body represented by the following structural formula (b) was detected.

[Chem. 12]

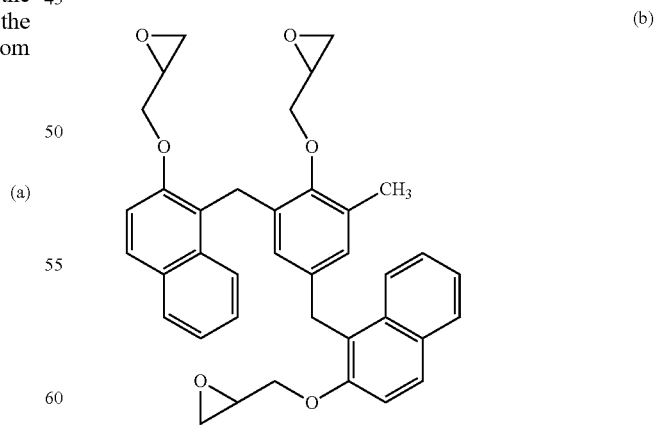

(b)

Example 2

Figure 5:
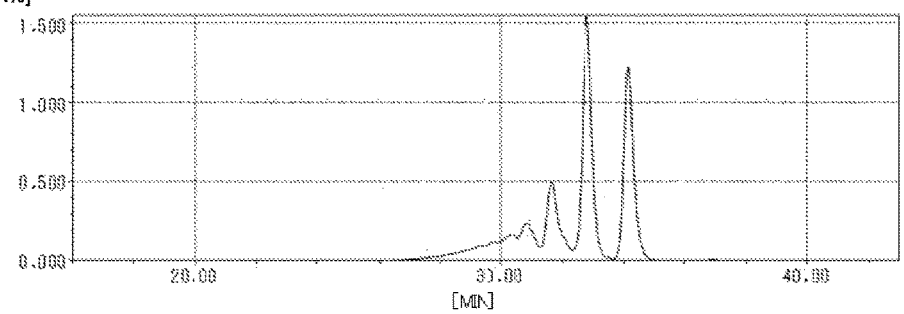
FIG. 5 is a GPC chart of an epoxy resin (A-2) obtained in Example 2.

Except that the amount of a 37%-formaline aqueous solution and that of ortho-cresol were changed to 107 parts by mass (1.32 moles) and 61 parts by mass (0.56 moles), respectively, 188 parts by mass of an epoxy resin (A-2) was obtained in a manner similar to that of Example 1. A GPC chart of the epoxy resin (A-2) thus obtained is shown in FIG. 5. The epoxy equivalent, the softening point, and the molecular weight distribution (Mw/Mn) of the epoxy resin (A-2) were 232 g/equivalent, 76° C., and 1.32, respectively. The content of a component corresponding to the above dimer (x2), the content of a component corresponding to the trifunctional compound (x3) represented by the following structural formula (b), and the content of a component corresponding to the tetrafunctional compound (x4), each of which was calculated from the GPC chart, were 27.4%, 35.4%, and 14.6%, respectively, and the total content thereof was 77.4%. In addition, the total content of the dimer (x2), the trifunctional compound (x3), the tetrafunctional compound (x4), and the polyfunctional compound (X) in which n represents any one of 3 to 5 was 90.5%.

Example 3

Figure 6:
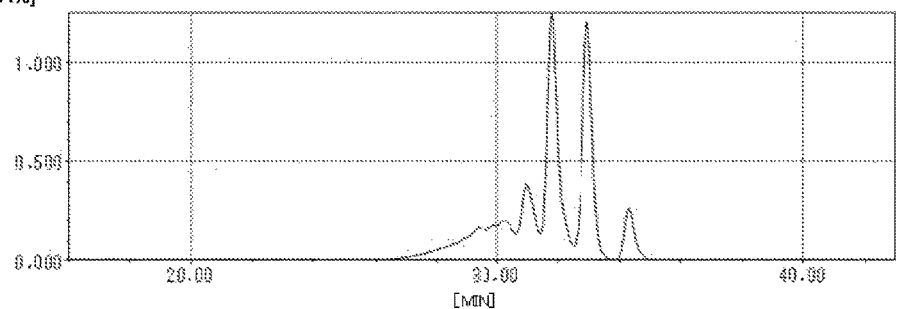
FIG. 6 is a GPC chart of an epoxy resin (A-3) obtained in Example 3.

Except that the amount of a 37%-formaline aqueous solution and that of ortho-cresol were changed to 152 parts by mass (1.87 moles) and 122 parts by mass (1.13 moles), respectively, 190 parts by mass of an epoxy resin (A-3) was obtained in a manner similar to that of Example 1. A GPC chart of the epoxy resin (A-3) thus obtained is shown in FIG. 6. The epoxy equivalent, the softening point, and the molecular weight distribution (Mw/Mn) of the epoxy resin (A-3) were 226 g/equivalent, 87° C., and 1.24, respectively. The content of a component corresponding to the above dimer (x2), the content of a component corresponding to the trifunctional compound (x3) represented by the following structural formula (b), and the content of a component corresponding to the tetrafunctional compound (x4), each of which was calculated from the GPC chart, were 6.0%, 27.9%, and 31.7%, respectively, and the total content thereof was 65.6%. In addition, the total content of the dimer (x2), the trifunctional compound (x3), the tetrafunctional compound (x4), and the polyfunctional compound (X) in which n represents any one of 3 to 5 was 87.6%.

Comparative Synthesis Example 1

To a flask equipped with a thermometer, a dripping funnel, a condenser, a fractionating column, and a stirrer, 505 parts by mass (3.50 moles) of α-naphthol, 158 parts by mass of water, and 5 parts by mass of oxalic acid were charged and then heated from room temperature to 100° C. over 45 minutes while being stirred. Subsequently, 177 parts by mass (2.45 moles) of a formalin aqueous solution at a concentration of 42 percent by mass was dripped over 1 hour. After the dripping was completed, stirring was further performed at 100° C. for 1 hour, and the temperature was then increased to 180° C. over 3 hours. After the reaction was completed, moisture remaining in the system was removed by heating at a reduced pressure, so that 498 parts by mass of a naphthol resin (a'-1) was obtained. The hydroxide equivalent of the naphthol resin (a'-1) thus obtained was 154 g/equivalent.

Figure 7:
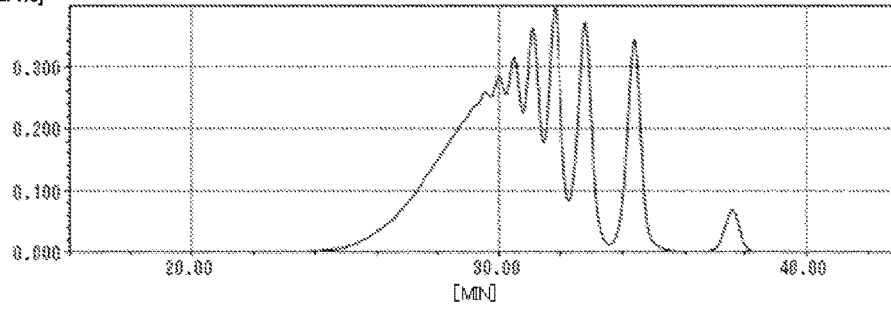
FIG. 7 is a GPC chart of an epoxy resin (A'-1) obtained in Comparative Synthesis Example 1.

Next, to a flask equipped with a thermometer, a condenser, and a stirrer, 154 parts by mass (1.0 hydroxide equivalent) of the naphthol resin (a'-1) obtained by the above reaction was processed in a manner similar to that of Example 1 while nitrogen purge was performed, so that 202 parts by mass of an epoxy resin (A'-1) was obtained. A GPC chart of the epoxy resin (A'-1) thus obtained is shown in FIG. 7. The epoxy equivalent of the epoxy resin (A'-1) was 237 g/equivalent.

Examples 4 to 6 and Comparative Example 1

In accordance with the composition shown in the following Table 1, TD-2090 (phenol novolac resin, hydroxide equivalent: 105 g/eq, manufactured by DIC Corp.) as a curing agent, (A-1), (A-2), (A-3), or (A'-1) as an epoxy resin, and 2-ethyl-4-methylimidazole (2E4MZ) as a curing promoter were blended with each other, and methyl ethyl ketone was also blended therewith so that the final nonvolatile (N.V.) of each composition was controlled to 58 percent by mass. Subsequently, a laminate plate was experimentally formed by curing under the following conditions, and the coefficient of thermal expansion and the change in characteristics were evaluated by the following methods. The results are shown in Table 1.

<Laminate Plate Forming Conditions>
Substrate: glass cloth "#2116" (210×280 mm), manufactured by Nitto Boseki Co., Ltd.
Number of ply: 6, Prepreg formation condition: 160° C., Curing conditions: 200° C. for 1.5 hours at 40 kg/cm², Thickness after molding: 0.8 mm <Change in Heat Resistance by Thermal History (Amount of Change in Heat Resistance: ΔTg): DMA (Difference in Tg Between First Measurement and Second Measurement)>

By the use of a viscoelasticity measurement apparatus (DMA: solid viscoelasticity measurement apparatus "RSAII", manufactured by Rheometric Scientific Inc., rectangular tension method, frequency: 1 Hz, temperature rise rate: 3° C./min), a temperature (Tg) at which the change in elastic modulus was maximized (the rate of change in tan δ was maximized) was measured twice under the following temperature conditions.

Temperature Conditions
First measurement: the temperature is increased from 35° C. to 275° C. at a temperature rise rate of 3° C./min.
Second measurement: the temperature is increased from 35° C. to 330° C. at a temperature rise rate of 3° C./min.
The difference in temperature obtained therefrom was evaluated as ΔTg.

<Coefficient of Thermal Expansion>

A laminate plate having a size of 5 mm×5 mm×0.8 mm obtained by cutting was used as a test piece, and a thermomechanical analysis was performed in a compression mode using a thermomechanical analytical apparatus (TMA, SS-6100, manufactured by Seiko Instruments Inc.).

Measurement Conditions
Measurement load: 88.8 mN
Temperature rise rate: 10° C./min, two times
Measurement temperature range: −50° C. to 300° C.
Measurement was performed twice using the same sample under the above conditions, and in the second measurement, the average coefficient of thermal expansion in a range of 40° C. to 60° C. was evaluated as the coefficient of thermal expansion.

TABLE 1

|  |  | Example 4 | Example 5 | Example 6 | Comparative Example 1 |
|---|---|---|---|---|---|
| Epoxy Resin | (A-1) | 68.4 |  |  |  |
|  | (A-2) |  | 68.8 |  |  |
|  | (A-3) |  |  | 68.3 |  |
|  | (A'-1) |  |  |  | 69.3 |

TABLE 1-continued

| | | Example 4 | Example 5 | Example 6 | Comparative Example 1 |
|---|---|---|---|---|---|
| Curing Agent | TD-2090 | 31.6 | 31.2 | 31.7 | 30.7 |
| 2E4MZ | | 0.05 | 0.05 | 0.05 | 0.05 |
| ΔTg(° C.) | | 4 | 4 | 6 | 15 |
| Coefficient of Thermal Expansion (ppm) | | 47 | 48 | 53 | 60 |

The abbreviations in Table 1 are as follows.

TD-2090: phenol novolac type phenol resin ("TD-2090", hydroxide equivalent: 105 g/eq, manufactured by DIC Corp.)

2E4MZ: curing promoter (2-ethyl-4-methylimidazole)

The invention claimed is:

1. An epoxy resin which is obtained by polyglycidyl etherification of a reaction product formed from ortho-cresol, a β-naphthol compound, and formaldehyde and which comprises as a necessary component, a dimer (x2) represented by the following structural formula (1)

[Chem. 1]

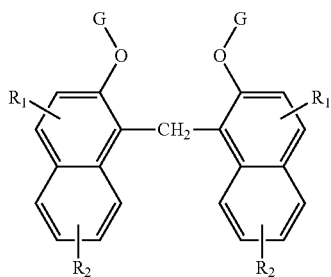

(1)

in the formula, $R^1$ and $R^2$ each independently represent a hydrogen atom, an alkyl group having 1 to 4 carbon atoms, or an alkoxy group having 1 to 4 carbon atoms, and G represents a glycidyl group);

a trifunctional compound (x3) represented by the following structural formula (2)

[Chem. 2]

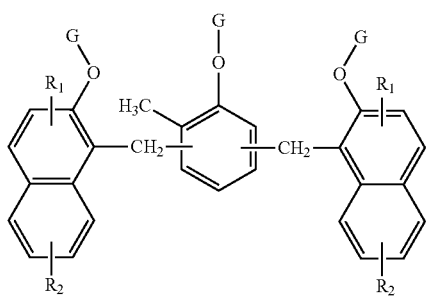

(2)

(in the formula, $R^1$ and $R^2$ each independently represent a hydrogen atom, an alkyl group having 1 to 4 carbon atoms, or an alkoxy group having 1 to 4 carbon atoms, and G represents a glycidyl group); and a tetrafunctional compound (x4) represented by the following structural formula (3)

[Chem. 3]

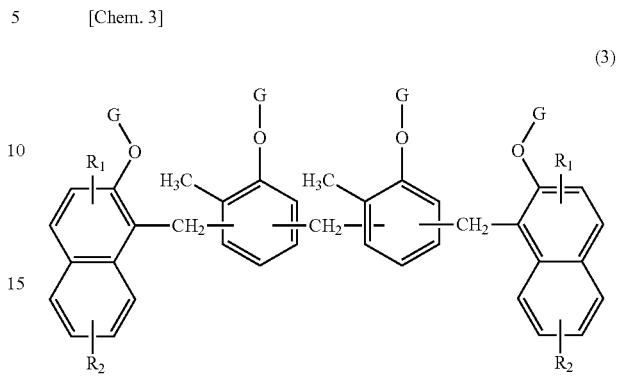

(3)

(in the formula, $R^1$ and $R^2$ each independently represent a hydrogen atom, an alkyl group having 1 to 4 carbon atoms, or an alkoxy group having 1 to 4 carbon atoms, and G represents a glycidyl group)

wherein the total content of those components is 65% or more in terms of the area rate in GPC measurement, and the content of the tetrafunctional compound (x4) is in a range of 10% to 40% in terms of the area rate in GPC measurement; and a value of the molecular weight distribution (Mw/Mn) is in a range of 1.00 to 1.50.

2. The epoxy resin according to claim 1, wherein the epoxy equivalent is in a range of 220 to 300 g/eq.

3. The epoxy resin according to claim 1, wherein the softening point is in a range of 70° C. to 100° C.

4. A curable resin composition comprising as a necessary component: the epoxy resin according to claim 1; and a curing agent.

5. A printed circuit board obtained by a process comprising: impregnating a reinforcing substrate with a varnish resin composition formed by further blending an organic solvent with the curable resin composition according to claim 4; overlapping copper foil on the reinforcing substrate; and performing heat pressure bonding.

6. A cured product obtained by a curing reaction of the curable resin composition according to claim 4.

7. The cured product according to claim 6, wherein as for Tg measured by a viscoelasticity measurement apparatus, the difference in Tg (ΔTg) between a first measurement and a second measurement is 6° C. or less.

8. A method for manufacturing an epoxy resin according to claim 1, the method comprising: performing a reaction between a β-naphthol compound and formaldehyde in the presence of an organic solvent and an alkaline catalyst and then performing a reaction by adding ortho-cresol in the presence of formaldehyde to obtain a cresol-naphthol resin (step 1); and then performing a reaction between the cresol-naphthol resin and an epihalohydrin (step 2) to obtain an epoxy resin.

9. The method for manufacturing an epoxy resin according to claim 8, wherein the step 1 is performed under a temperature condition of 40° C. to 100° C.

10. A method for manufacturing an epoxy resin according to claim 1, the method comprising: performing a reaction among ortho-cresol, a β-naphthol compound, and formaldehyde in the presence of an organic solvent and an alkaline catalyst to obtain a cresol-naphthol resin (step 1); and then performing a reaction between the cresol-naphthol resin and an epihalohydrin (step 2) to obtain an epoxy resin.

11. The method for manufacturing an epoxy resin according to claim 10, wherein the step 1 is performed under a temperature condition of 40° C. to 100° C.

12. A curable resin composition comprising as a necessary component: the epoxy resin according to claim 2; and a curing agent.

13. A curable resin composition comprising as a necessary component: the epoxy resin according to claim 3; and a curing agent.

14. A cured product obtained by a curing reaction of the curable resin composition according to claim 12.

15. The cured product according to claim 14, wherein as for Tg measured by a viscoelasticity measurement apparatus, the difference in Tg (ΔTg) between a first measurement and a second measurement is 6° C. or less.

16. A printed circuit board obtained by a process comprising: impregnating a reinforcing substrate with a varnish resin composition formed by further blending an organic solvent with the curable resin composition according to claim 12; overlapping copper foil on the reinforcing substrate; and performing heat pressure bonding.

* * * * *